United States Patent [19]

Huang

[11] Patent Number: 5,610,931
[45] Date of Patent: Mar. 11, 1997

[54] TRANSIENT PROTECTION CIRCUIT

[75] Inventor: Sun-Yuan Huang, Blandon, Pa.

[73] Assignee: Lucent Technologies Inc., Murray Hill, N.J.

[21] Appl. No.: 570,738

[22] Filed: Dec. 11, 1995

[51] Int. Cl.⁶ .................................................. H01S 3/00
[52] U.S. Cl. ............................................ 372/38; 372/29
[58] Field of Search .............................. 372/38, 29, 33; 361/33, 119; 538/20; 219/511

[56] References Cited

U.S. PATENT DOCUMENTS

| | | | |
|---|---|---|---|
| 4,069,465 | 1/1978 | Kouchich et al. | 338/20 |
| 4,348,648 | 9/1982 | Childs | 372/29 |
| 4,489,415 | 12/1984 | Jones, Jr. | 372/38 |
| 4,780,598 | 10/1988 | Fahey et al. | 219/511 |
| 4,999,728 | 3/1991 | Curl | 361/33 |
| 5,537,287 | 7/1996 | Dreier | 361/119 |

*Primary Examiner*—Leon Scott, Jr.

[57] ABSTRACT

Semiconductor lasers are susceptible to harmful high currents or high voltage electrical transients. Semiconductor pump lasers are especially vulnerable to electrical transients under normal operation because of the large continuous wave current needed to drive the semiconductor pump laser to achieve a high optical power. A protection circuit for 980 nm pump lasers using a non-linear voltage-dependent resistance means which limits drive current based on a drive voltage powering a laser diode is demonstrated to be effective in guarding the laser against harmful electrical transients.

15 Claims, 7 Drawing Sheets

TRANSIENT PROTECTION CIRCUIT

FIELD OF THE INVENTION

This invention relates generally to electrical transient protection for pump laser modules; and, more particularly to protection circuitry providing such protection for semiconductor laser diodes.

BACKGROUND OF THE INVENTION

Optical communications systems using optical fibers to convey information between a light source and a light detector are presently of significant and growing commercial interest.

An optical communication technique uses optical amplifiers to span long distances. The optical amplifiers used in such technique can have a segment of a rare earth doped length of optical fiber which is pumped by a light source. The light source used in such systems is commonly a semiconductor laser. The doped segment of optical fiber amplifies the incoming optical signal and emits an amplified optical signal. An exemplary dopant is erbium and erbium doped fiber amplifiers are often referred to by the acronym EDFA.

Semiconductor laser diodes are susceptible to high current and high voltage electrical transients, such as electrical static discharge (ESD) or electrical over stress (EOS). The large continuous wave (CW) current needed to drive a semiconductor pump laser to achieve a high optical power makes semiconductor pump lasers even more vulnerable to electrical transients under normal operation. Specifically, nine-hundred eighty (980) nm pump lasers can be damaged due to EOS in the laboratory and in the field.

A commercially available transient suppressor used to provide a short turn-on time (e.g., <1 ns) is a Zener diode. Zener diodes only protect against drive current transients in a single current direction, however.

SUMMARY OF THE INVENTION

The ability of laser diodes to resist damaging electrical transients is improved according to the principles of the invention. A nonlinear voltage-responsive device is used to absorb harmful electrical transients while maintaining high optical power laser operation under normal conditions. A protection circuit including a low voltage multilayer ZnO varistor for transient suppression is coupled to a nine-hundred eighty (980) nm pump laser diode in an illustrative embodiment of the invention. Multilayer ZnO varistors have, according to the principles of the invention, several advantages over Si Zener diodes for guarding against harmful transient effects: bidirection, rise time, and size per unit power.

During normal laser operating conditions the protection circuit appears substantially as if it does not exist. During harmful transient strikes, the protection circuit operates to bypass current away from driving the laser diode in order to protect the laser diode.

Other features and advantages of the invention will become apparent from the following detailed description, taken in conjunction with the accompanying drawing, which illustrates, by way of example, the features of the invention.

DETAILED DESCRIPTION

Figure 1A:
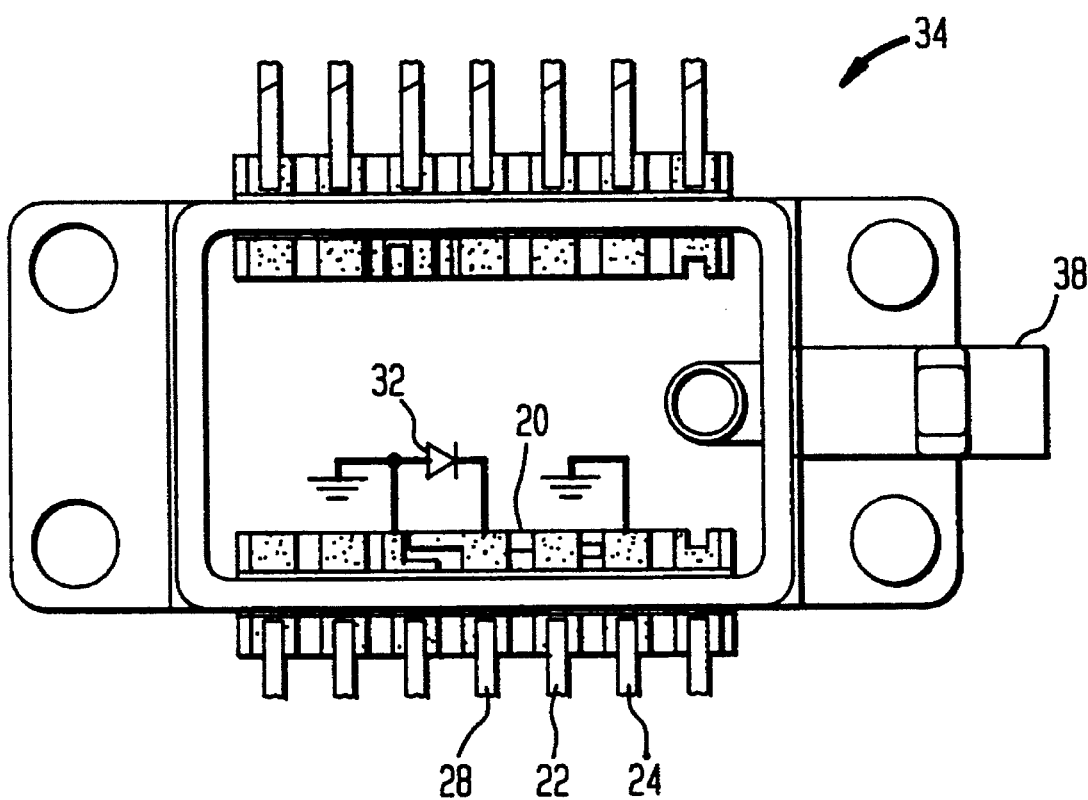
FIG. 1(a) is a representation of the physical layout of a protected pump laser module according to the principles of the invention.
Figure 1B:
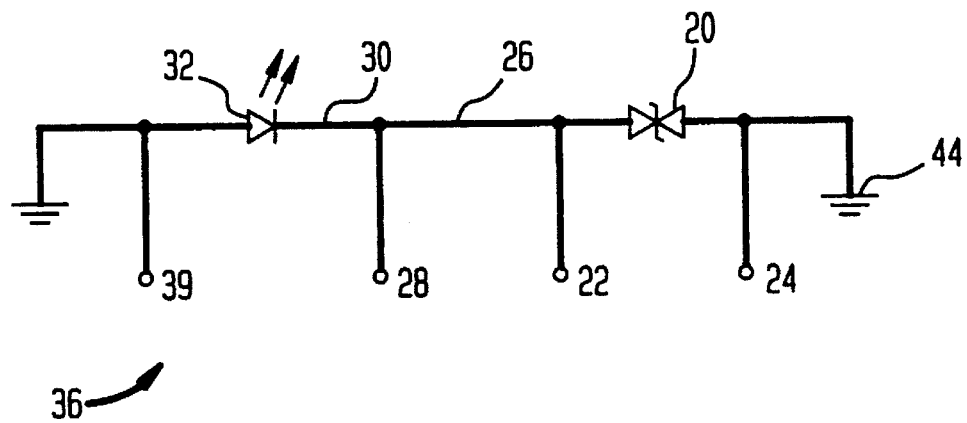
FIG. 1(b) is a representation of the equivalent circuit diagram of the protected pump laser module depicted in FIG. 1(a) according to the principles of the invention.

A protection circuit according to a preferred embodiment of the invention protects a semiconductor laser diode without affecting its normal operating conditions and emitted optical power. Circuitry for protecting pump laser modules according to the principles of the invention is depicted in FIGS. 1(a) and 1(b). A voltage-responsive means 20 for providing resistance to current flow, which in the preferred embodiment is a varistor, is surface-mounted to bonding pads of a first pin 22 and a second pin 24 using a eutectic solder comprising Pb and Sn. The non-linear voltage-responsive varistor has a size of about sixty-three (63) mil by about thirty-two (32) mil so as to fit on the bonding pads. A bonding wire 26 is connected from a third pin 28 to the first pin 22 to form a connection to the cathode 30 of a laser diode 32 mounted within the laser module 34. The bonding wire 26 can be easily disconnected for unprotected use and testing. An equivalent circuit diagram representation of the protection circuit 36, in which the varistor 20 is connected in parallel with the laser diode 32 is shown in FIG. 1(b).

Electrical transients in drive current are dangerous for biased laser modules. Harmful transients in the drive current can occur, for example, when the laser module is switched on and off and when lightning strikes.

The 980 nm pump laser module contains a semi-conductor laser diode which is electrically powered to emit coherent radiation in continuous wave (CW) mode. Pulses to the laser diode can simulate spikes and surges in experimental testing.

According to the principles of the invention, the non-linear varistor 20 is coupled in parallel with the laser diode 32. The non-linear varistor provides varying resistance for different ranges of drive voltages in the bias circuit.

The laser module 34 is embodied as a package containing the laser diode 32. The laser module in the preferred embodiment has a height of 0.3 inches, a length of 1 inch, and a width of 0.5 inches. The laser diode 32 inside the laser module 34 is approximately thirty (30) mils long.

The laser module presents an output port 38 which can be coupled to an optical fiber which receives and directs laser emissions. The varistor 20 is surface mounted to the bonding pads 22, 24 of the laser module 34 to protect the laser diode 32 within the laser module 34. Electrical power is applied to the laser diode using the third pin 28 and a fourth pin 39 at electrical ground to provide a current for driving the laser diode 32, which can be converted to optical power. In operation, the semiconductor laser diode is powered to emit coherent electromagnetic radiation.

Such a varistor has never been used in a protection circuit as taught herein; rather, a Zener diode has been used to protect against harmful electrical transients. A short-coming of the Zener diode approach is that when a Zener diode is used, protection is provided only in one direction, e.g., forward, of laser drive current. Transients in the other direction are still able to harm the laser diode. Conventionally, when a zener diode is used, surges in both directions of the laser current are not adequately protected.

There have been previous failed attempts to use a varistor; specifically, the breakdown voltage of the varistor, at which the impedance provided by the varistor starts to change, was very high. The "working range" defined by the breakdown voltage of the high-voltage varistors employed was too high to provide protection against surges caused by transients on the drive voltage.

According to the principles of the invention, a quick-response low-voltage varistor in circuit with the laser diode can protect the laser diode from the effects of harmful transients in the drive current powering the laser diode.

Figure 1C:
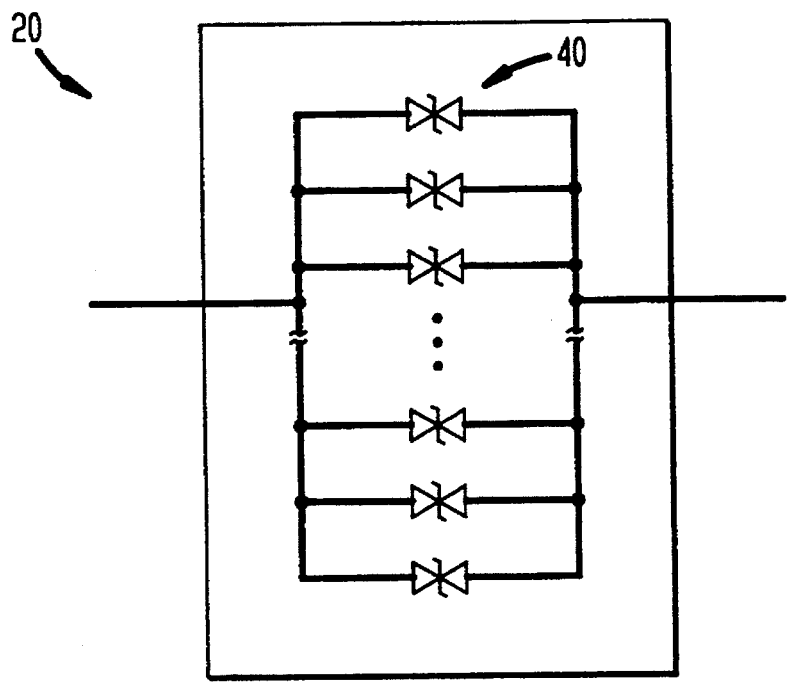
FIG. 1(c) is a representation of resistance means in the equivalent circuit according to the principles of the invention.

A varistor provides non-linear resistance based on applied voltage and, in the preferred embodiment, the varistor is produced by multi-layer ceramic technology. The varistor is an amorphous crystal of many grains. Each grain operates like a Zener diode. Referring to FIG. 1(c), an equivalent circuit for a varistor 20 can be modeled as two Zener diodes in a point-to-point series 40, with many (>1000) of such series in parallel.

Referring to FIG. 1(b), the resistance (or conductance) of the varistor 20 is voltage dependent. At a low (DC and transient) voltage across the varistor 20, the resistance of the varistor is high. As a result, there is a small leakage current from the drive voltage 28 into the varistor 20 at such a low voltage.

The semiconductor laser diode ought to have approximately 2.5 Volts for typical high-output optical power operations. When a harmful transient appears in the drive current as a result of, for example, lightning or from switching the laser module on and off, the impedance provided by the varistor 20 in circuit 36 drops quickly out of its working range and draws away the current surge to electrical ground 44. During regular operating conditions, only a small amount of drive current is consumed by the protection circuit 36 arrangement. The ratio of leakage current to drive current under normal conditions can be greater than one to ten-thousand (1/10,000), which is an advantage of this arrangement. Thus, most of the current can be used for generating a laser beam.

The varistor has a very low conduction within a certain voltage range. As the drive voltage goes beyond a breakdown point (or "working") voltage, the resistance of the varistor becomes very small as a result of its non-linear characteristics. Thus, the resistance of the voltage-activated varistor varies with voltage.

Figure 2:
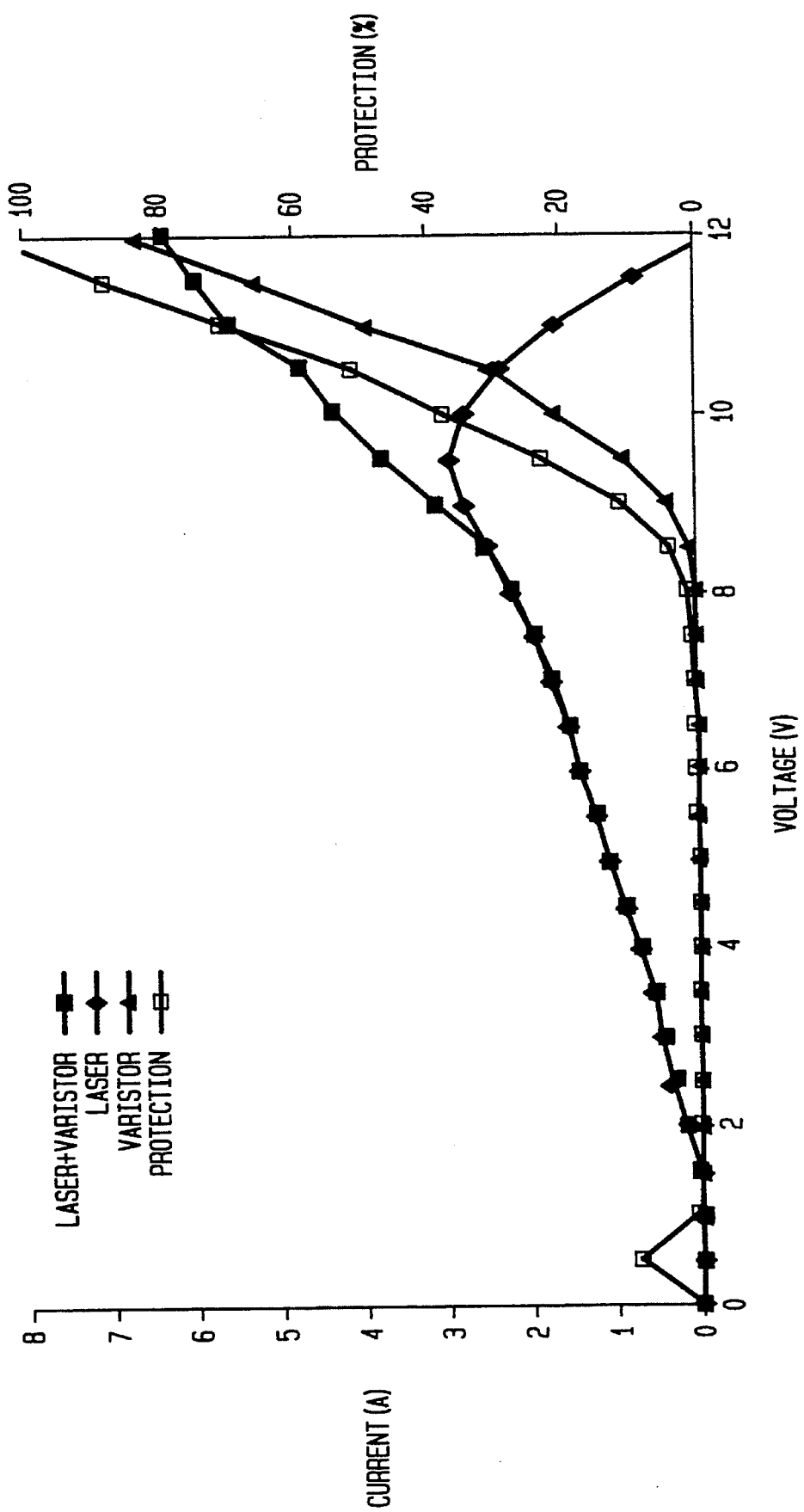
FIG. 2 is a graph of current and calculated protection versus voltage characteristics of a laser and a varistor.

Protective operation of the varistor 20 in the protection circuit 36 is initiated in response to the voltage 22, 28 appearing at the cathode 30 of the semiconductor laser diode 32 (FIGS. 1 and 2). When the cathode voltage 22, 28 moves away from, or goes beyond, the "working" voltage range of the varistor 20, protection provided by the varistor "kicks in".

An important aspect of utilizing the preferred embodiment of the invention is in selecting the proper voltage breakdown point of the voltage-responsive varistor 20 for the protection circuit 36 based on an understanding of the optimum working voltage range of the semiconductor laser diode 32 used to generate the laser beam.

Below 1.2 volts biasing the laser diode there is substantially no emission. The laser diode begins to emit laser light at about 1.2 volts biasing the laser diode. Between 1.2 volts and 2.5 volts there is emitted optical power. A drive voltage of, for example, 2.5 volts provides a drive current that will enable the laser diode to emit high optical power. Above 2.5 volts of drive voltage approaches a harmful condition for which the protection circuit ought to activate.

The drive current under normal operating conditions is 200 mA, and most of the drive current goes to drive the laser diode to emit a useful laser beam. Only a very small leakage current passes through the varistor under normal operating conditions, around 10 µA, which is an insignificant amount.

The very small ratio of leakage current to drive current under normal operating conditions ensures that the presence of the varistor, in circuit with the laser diode, will not degrade the performance of the laser diode. This is an important advantage provided by the present invention.

In the preferred embodiment, the breakdown voltage, which defines the voltage working range across the varistor 20, is 3.6 Volts at which conduction is low and corresponds, as selected, to a harmful amount of peak drive voltage for the operating laser diode 32. If the electric potential difference across the varistor 20 becomes an amount greater than such breakdown voltage, defining the working range of the varistor and selected to correspond to the harmful peak drive voltage value, then the varistor resistance drops quickly so that the leakage current increases rapidly compared to the drive current through the semiconductor laser diode to protect the laser diode.

During the transition period of changing current in the laser diode 32 and varistor 20 as the varistor protection actuates, the current through the varistor rapidly increases, while the drive current into the laser decreases (as the drive current bypasses the laser diode).

The transition period for the varistor 20, as the varistor bypass begins to draw the current to electrical ground during the harmful transient conditions, is faster than the surge of harmful current into the laser diode 32. The varistor 20 has a rise or fall time for the change of resistance of about one nanosecond (1 ns). Current rising or falling in the laser diode 32 is slower, with a ten nanosecond (10 ns) response time.

The working range of the laser diode in the preferred embodiment is about 1.2 V through 2.5 V. The varistor provides a voltage-dependant resistance means having a working range of less than about 3.6 Volts across the varistor and a breakdown point of greater than about 3.6 Volts. Within its working range, the varistor 20 presents a higher impedance than the laser diode 32 presents. Above the breakdown voltage of the varistor 20, the impedance of the varistor drops and the drive current bypasses the laser diode 32 through the varistor to electrical ground 44 to protect the laser diode. The higher impedance of the varistor within its working range causes only a small leakage current so that the varistor coupled to the laser diode in the protection circuit 36, as taught herein, does not interfere with normal laser diode operations.

The maximum forward current for a 980 nm pump laser is 500 mA at a voltage less than 2.5 Volts. Below 2.5 Volts, the leakage current for the protection circuitry needs to be less than 100 µA to avoid affecting laser operation. This causes less than a 0.1% reduction in operating current or less than 0.1 mW reduction in optical output power.

980 nm semiconductor diode laser (SDL) lasers are capable of withstanding transient energy in a bi-normal distribution: one group having a 1 µs-A damage threshold and another group having a 10 µs-A damage threshold.

The measured current vs. voltage (IV) characteristics provided to the laser by an AVX VC060303A100 varistor are shown in FIG. 2. The curve was measured under DC conditions below 5 Volts. The curve was measured under a single pulse condition with a 1 µs pulse-width for above 5 volts. Using pulse measurement avoids a heating effect on the varistor. A Keithely 617 electrometer was used to measure voltage and current for DC measurements.

Figure 3A:
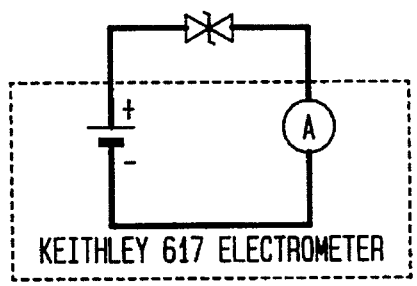
FIG. 3(a) is a representation of an arrangement for D.C. measurement for varistors.
Figure 3B:
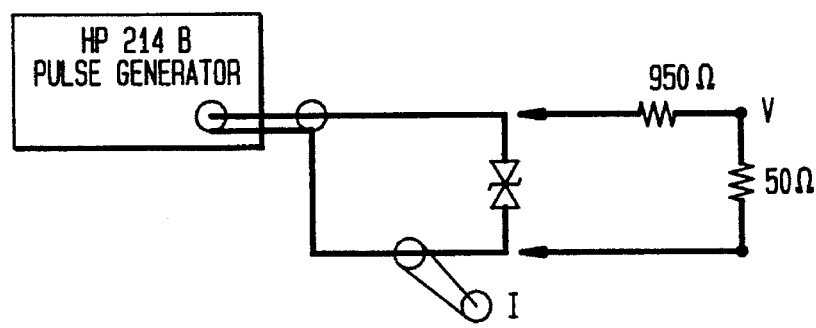
FIG. 3(b) is a representation of an arrangement for direct pulse measurement for varistors.
Figure 4:
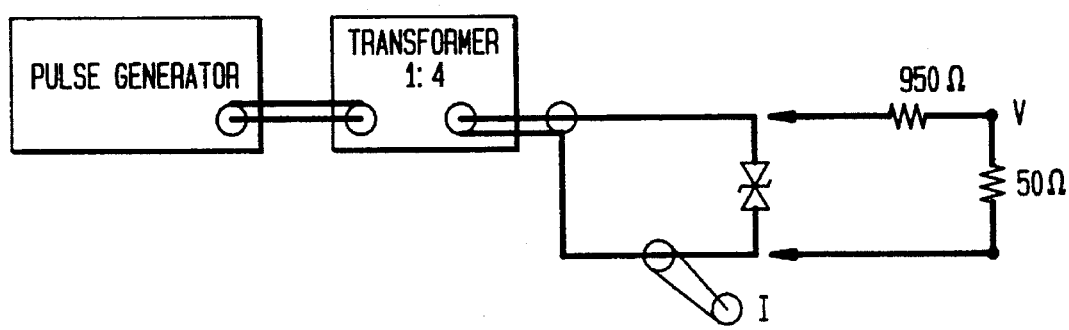
FIG. 4 is a representation of an arrangement for pulse measurement with 1:4 reduced impedance.

An experimental setup is shown in FIG. 3(a). The DC current at 2.5 V is 2 µA, which is below the design limit of 100 µA. Impedance matching is considered appropriate for pulse measurement. Below 2 A the pulse from a HP 214B pulse generator with 50 Ohm output impedance was directly fed into the varistor (FIG. 3b). Above 2 A an AVTECH transformer, AVX-MRB6, was used between the pulse generator and the varistor to boost the current up to four times and to reduce the output impedance to 3 Ohms (FIG. 4). This helps to reduce ringing and to maximize the power transfer to the varistor.

The measured current vs. voltage (IV) characteristics for a combined laser and varistor are also depicted in FIG. 2. The laser is connected in parallel to the varistor. The current through the laser can be calculated in the pulse mode using Kirchhoff's current law. The protection factor, defined as the percentage of the varistor current divided by the total current, is also plotted. It can be seen from FIG. 2 that if the employed device can withstand a 3 A (worst case) transient, the varistor will provide sufficient protection.

The LI characteristics were also measured before and after protection for twelve (12) pump laser modules. There was no measurable difference in LI curves. This is consistent with the above DC measurement result.

EOS Test

Figure 5:
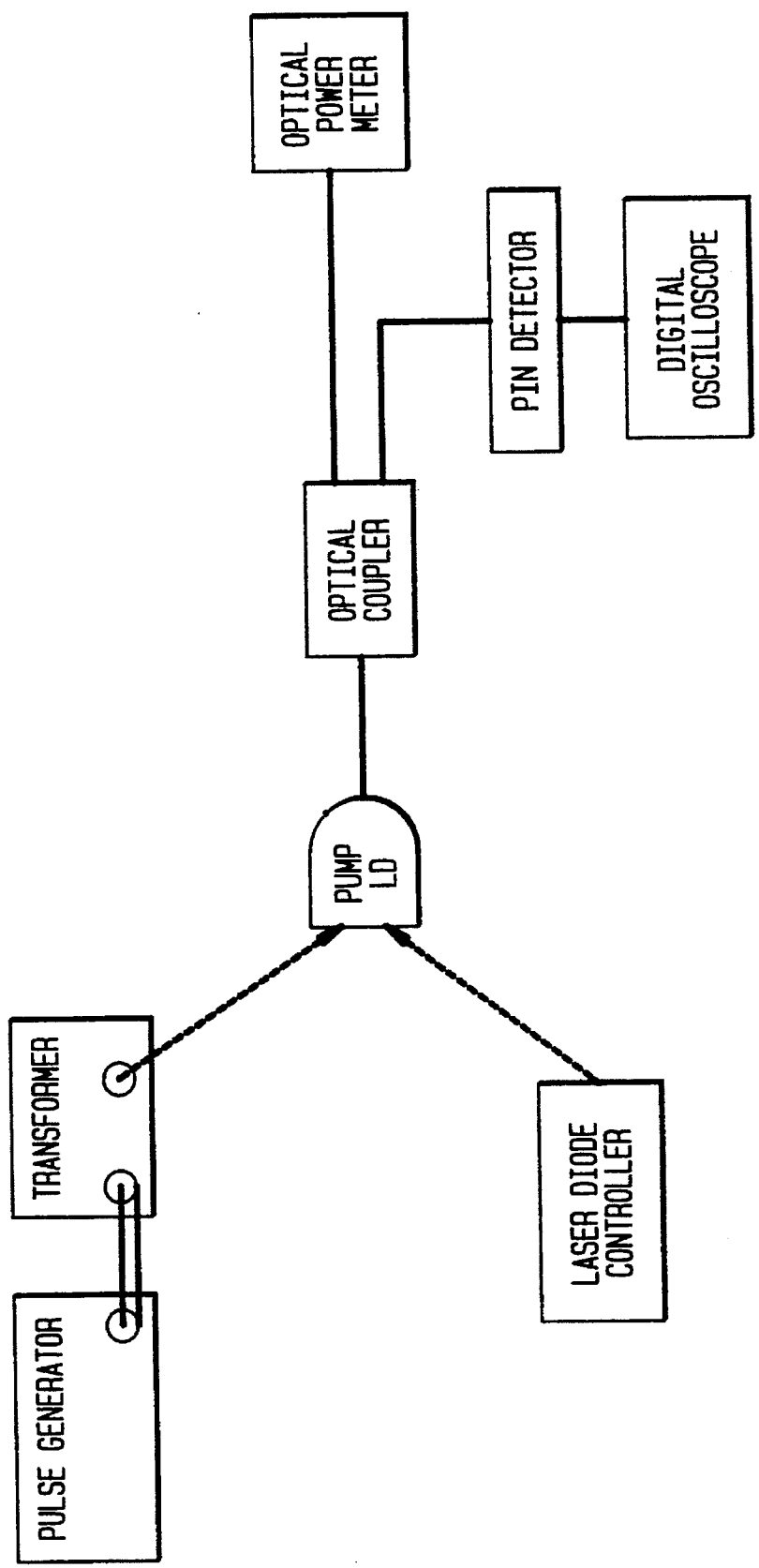
FIG. 5 is a representation of an EOS testing arrangement.

FIG. 5 shows an experimental configuration for EOS testing of pump laser modules. The lasers can be driven either in continuous wave (CW) mode or in pulse mode by swapping to different fixtures. The transient current pulse was detected by a wide band current probe. A 1% optical coupler at 980 nm was used for splitting the light for continuous wave (CW) detection (high output port) and pulse detection (low output port). A pin photodiode with a band-width greater than 1 GHz was used to monitor the optical transient response.

The first device tested, SN004, was directly driven from a 50 Ohm output of an HP 214 pulse generator. Since the laser resistance is around 3 Ohms, this produced 100% ringing both at the leading and falling edge of a 1 µs pulse. The voltage setting was increased from 10 V to 90 V with a 10 V step. The laser was protected, and ten pulses were applied for each voltage setting. The laser survived to an 80 V setting with a peak forward current of 3.1 A, a peak reverse current of 1.48 A, a peak forward voltage of 12.0 V, a peak voltage of 12.5 V, and a peak optical power of 1.57 W. The device failed at the next higher setting of 90 V.

The second device, SN003, was driven with an impedance matched transformer. Ringing was diminished to less than 5%. The device, with protection, showed no damage resulting from 1 µs and 2.1 A pulses. The device was then protected and electrically stressed to 8 A, 100 ns, for 10 pulses. No damage was observed. The same device without protection also survived the same stress. Next, the device was protected again and electrically stressed to 8 A, 200 ns, 10 pulses. No damage was observed. The same device without protection failed at a 3.48 A, 200 ns pulse.

The third device, SN001, was also driven with the impedance matched transformer. The device showed no damage with or without protection up to 8 A, 400 ns, 10 pulses. The device with protection failed at 5.5 A, 600 ns pulses.

A pulse-width scan and a pulse-current scan were conducted.

Pulse-width Scan

In this test the pulse-current was started at 0.5 A with 0.5 A increments and the pulse-width was scanned at 0.5 µs, 1 µs, 2.5 µs, 5 µs and 10 µs. Each device was struck five times at each combination of pulse-current and pulse-width. First, the device was protected at each current level. After testing to 10 µs, the device was unprotected and the testing was repeated. There are a total of eleven (11) devices for this test. Nine devices survived the test up to 1 A and 10 µs. Two devices failed to provide protection with a pulse-current of 1 A and pulse-widths of 5.5 µs and 4.5 µs during the first pulse for 7.5 µs and 5 µs pulse-widths, respectively.

Pulse-current Scan

In this test the pulse-width was set at 500 ns, 1 µs, 1.5 µs or 4 µs and the pulse-current was scanned from 1 A to 8 A with 1 A step. Five pulses were applied to each device for each test. The device was first protected for a fixed pulse width. After finishing testing to 8 A, the device was unprotected and the test was repeated. One device, SN156, survived up to 8 A, 500 ns pulses with protection and failed without protection at the first pulse of 7.4 A, 500 ns. Another device, SN152, survived up to pulses of 8 A, 1 µs with protection and failed without protection at the first pulse of 7.5 A, 1 µs. Yet another device, SN2588, survived up to 8 A, 2 µs pulses with protection and failed without protection at the first pulse of 7.1 A, 2 µs.

Two devices failed with protection at 4 µs, 5 A and 2 A, respectively. One device failed with protection at 2 µs and 2 A. Two devices failed with protection with 1.5 µs and 8 A. Two devices survived with and without protection up to 8 A and 500 ns.

Results

Figure 6:
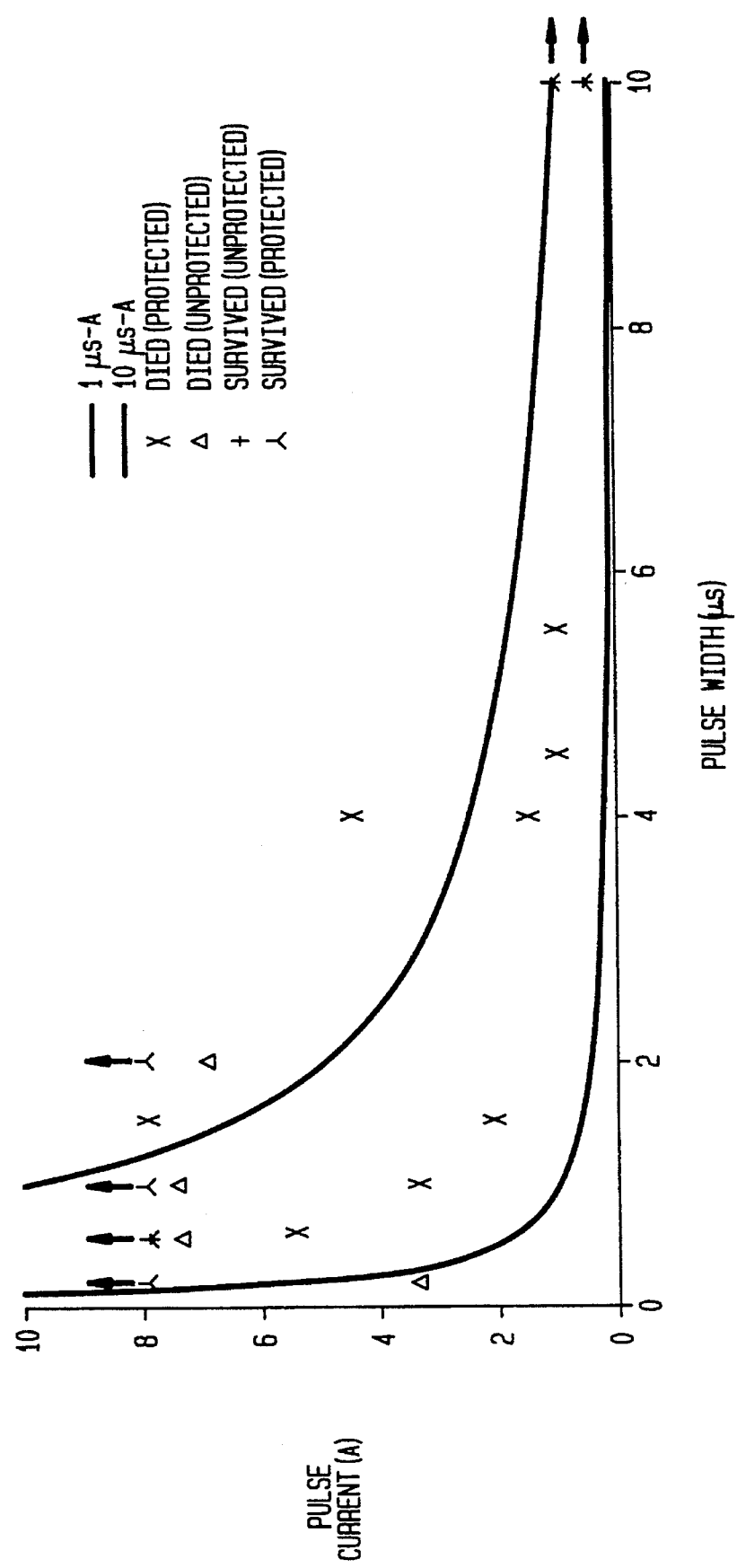
FIG. 6 is a graph of damaged and surviving pulse-current versus pulse-width under EOS for 980 nm pump laser modules.

Twenty total devices were tested for various electrical transients. FIG. 6 depicts a plot of the damaged and survival points for the twenty devices on the pulse-current and pulse-width plane. Based on the result they can be grouped into three categories: a first group of devices that survived under protection and died without protection; a second group of devices that failed under protection; and a third group of devices that survived both under protection and without protection.

In the first group, there are four devices that under protection survived up to 8 A of the electrical transient current with pulse-widths of 200 ns, 500 ns, 1 µs and 2 µs, respectively. Without protection, these four devices all failed below 8 A with the same pulse-widths. This group strongly supports the effectiveness of the protection circuitry according to the principles of the invention.

The second group can be subdivided into two subgroups: one with a damage threshold of around 5 µs-A and another with a damage threshold of greater than 12 μs-A. The first subgroup has six devices with an average damage threshhold of 4.6 μs-A and a standard deviation of 1.7 μs-A. A possible explanation of this result is that the solitary laser chips have a low damage threshold of around 1 μs-A, and, with protection their damage threshold can be improved by about five times. The second subgroup has three devices. The same possible explanation may be applied to this subgroup.

The third group included seven devices: six of which survived up to 10 μs-A, and one to 4 μs-A. This indicates that the solitary laser chips also have a population with a damage threshold greater than 10 μs-A.

Figure 7:
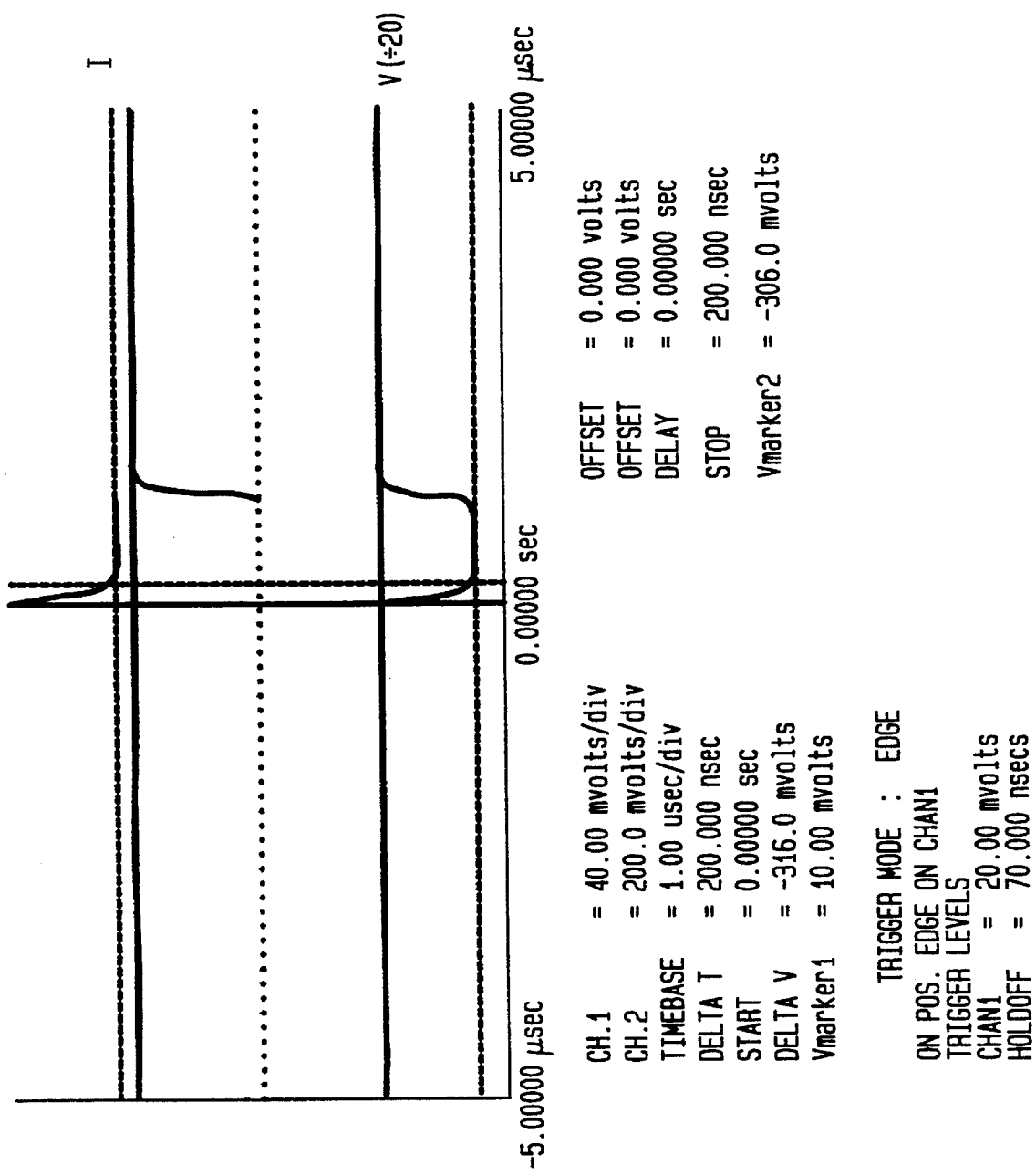
FIG. 7 is a graph of initial current absorption of the varistor.

Measuring the current voltage (IV) pulse curve of the varistor, shows that the initial current was five to ten times larger than the final settle-down current while the voltage is climbing (FIG. 7). This indicates that the initial current was used to charge the capacitance in the varistor. A laser protected according to the principles of the invention is benefited by this reduction in the initial transient. This possibly could explain the five times increase in the damage threshold for protected lasers, although FIG. 2 only predicts 12% protection at 1 A pulse-current level.

Since a typical ESD pulse has energy concentrated in the first 100 ns, the above tests represent more severe stress than ESD stress encountered in the field. A conservative estimate based a human body model (1500 Ohm and 100 pF) suggests that the pump laser module with a protection circuit according to the principles of the invention will survive a ESD transient of at least 12 kV.

From the foregoing description, it will be appreciated that a transient protection circuit according to the principles of the invention protects a pump laser module without degrading laser output under normal operating conditions. The protection circuit is especially effective for an electrical transient with a pulse-width of less than 2 μs. The principles of the invention can be applied to estimate ESD voltage rating for pump laser modules. The above estimate for ESD protection can be confirmed by performing failure mode analysis of the damaged devices and comparing the result with the field failure.

While several particular exemplary forms of the invention have been illustrated and described, it will be apparent that various modifications can be made without departing from the spirit and scope of the invention.

What is claimed is:

1. A protection circuit for protecting a laser diode from electrical transients, the laser diode having an anode coupled to a first electric potential and a cathode coupled to a drive potential and being powered by a drive current, comprising:

voltage-responsive resistance means electrically coupled to the cathode at the drive potential and to electrical ground, wherein the drive current substantially bypasses the resistance means during normal operation of the laser diode.

2. The invention as defined in claim 1, wherein:

the resistance means include a low-voltage varistor.

3. The invention as defined in claim 2, wherein:

the varistor is electrically coupled to the laser diode using a eutectic solder selected from the group consisting of Pb and Sn.

4. The invention as defined in claim 1, wherein:

the resistance means have a working voltage range defined by a breakdown voltage, and the breakdown voltage is selected based on operating conditions that are harmful to the laser diode.

5. The invention as defined in claim 1, wherein the resistance means comprise:

a multi-layer ceramic varistor coupled to the laser diode.

6. The invention as defined in claim 5, further comprising:

a bonding wire coupling the varistor to the laser diode.

7. The invention as defined in claim 1, wherein:

the first electric potential is at electrical ground.

8. A method for protecting a laser diode having an anode and a cathode from damage caused by electrical transients in a drive current powering the laser diode, comprising the steps of:

electrically coupling to the cathode of the laser diode and to electrical ground a voltage-responsive resistance means for providing a resistance to current which are responsive to voltage across the resistance means; and bypassing substantially all of the drive current away from the laser diode when there are harmful electrical transients in the drive current.

9. The invention as defined in claim 8, further comprising the step:

selecting the resistance means based on operating characteristics of the laser diode.

10. The invention as defined in claim 8, wherein the resistance means comprise:

a varistor.

11. The invention as defined in claim 8, wherein:

the cathode of the laser diode is coupled to a drive potential and the voltage-responsive resistance means are coupled to the drive potential and to electrical ground.

12. A laser circuit for generating coherent radiation, comprising:

a laser diode having an anode and a cathode, the anode of the laser diode is coupled to a first electric potential and the cathode of the laser diode is coupled to a drive potential; and voltage-responsive resistance means for providing a resistance to current which are responsive to voltage across the resistance means and coupled to the drive potential and to electrical ground.

13. The invention as defined in claim 12, wherein:

a drive current passes through the laser diode when the drive potential is in a working range of the resistance means with respect to electrical ground, and the drive current substantially by-passes the laser diode when the drive potential is outside of the working range of the resistance means.

14. A method for operating a laser circuit to generate coherent radiation, comprising the steps of:

(A) providing a laser circuit comprising a laser diode having an anode and a cathode, wherein the anode is coupled to a first electric potential and the cathode is coupled to a drive potential, and a voltage-responsive resistance means for providing a resistance to current which are coupled to the drive potential and to electrical ground;

(B) powering the laser diode with a drive current to generate coherent radiation; and (C) varying the resistance of the resistance means responsive to the drive current.

15. The invention as defined in claim 14, further comprising the step of:

limiting the drive current into the laser diode responsive to the drive potential.

* * * * *